(12) United States Patent
Terry

(10) Patent No.: US 10,432,242 B1
(45) Date of Patent: Oct. 1, 2019

(54) LOW NOISE BROADBAND AMPLIFIER WITH RESISTIVE MATCHING

(71) Applicant: Morse Micro Pty Ltd, Eveleigh, NSW (AU)

(72) Inventor: Andrew Terry, Picton (AU)

(73) Assignee: MORSE MICRO PTY LTD, Eveleigh, NSW (AU)

( * ) Notice: Subject to any disclaimer, the term of this patent is extended or adjusted under 35 U.S.C. 154(b) by 0 days.

(21) Appl. No.: 15/975,382

(22) Filed: May 9, 2018

(51) Int. Cl.
    *H04B 1/12*     (2006.01)
    *H03F 1/26*     (2006.01)
    *H03G 3/00*     (2006.01)
    *H04B 1/18*     (2006.01)

(52) U.S. Cl.
    CPC ............. *H04B 1/12* (2013.01); *H03F 1/26* (2013.01); *H03G 3/001* (2013.01); *H04B 1/18* (2013.01)

(58) Field of Classification Search
    CPC .......... H03F 3/45475; H03F 2200/294; H03F 2203/45138
    USPC .......... 455/232.1–253.2, 303–307, 309, 310, 455/312; 330/124 D, 124 R, 125, 126
    See application file for complete search history.

(56) References Cited

U.S. PATENT DOCUMENTS

| | | | | |
|---|---|---|---|---|
| 4,434,405 A * | 2/1984 | Gans | .......... | H03F 1/26 330/124 R |
| 4,757,270 A * | 7/1988 | Rokos | .......... | H03F 1/083 330/103 |
| 4,801,861 A * | 1/1989 | Ashley | .......... | G01R 23/165 324/613 |
| 5,345,471 A * | 9/1994 | McEwan | .......... | G01F 23/284 375/130 |
| 5,523,760 A * | 6/1996 | McEwan | .......... | G01F 23/284 342/89 |
| 5,604,460 A * | 2/1997 | Sehrig | .......... | H03G 1/0088 330/124 R |
| 5,744,385 A * | 4/1998 | Hojabri | .......... | H01L 27/0802 257/E27.047 |
| 5,880,634 A * | 3/1999 | Babanezhad | .......... | H03F 3/45475 327/557 |
| 6,148,048 A * | 11/2000 | Kerth | .......... | H04B 1/0007 341/139 |
| 6,556,077 B2 * | 4/2003 | Schaffer | .......... | H03F 1/083 330/150 |
| 6,566,854 B1 * | 5/2003 | Hagmann | .......... | G01R 15/183 324/117 R |
| 6,801,628 B1 * | 10/2004 | Thiel | .......... | H04S 1/00 381/56 |
| 6,856,796 B2 * | 2/2005 | Ding | .......... | H03F 1/3211 327/359 |
| 7,095,994 B1 * | 8/2006 | Aytur | .......... | H03F 1/0272 330/296 |

(Continued)

OTHER PUBLICATIONS

Murphy, David, et al. "A Noise-Cancelling Receiver Resilient to Large Harmonic Blockers," *IEEE Journal of Solid-State Circuits*, vol. 50, No. 6, Jun. 2015, pp. 1336-1350.

(Continued)

*Primary Examiner* — Edward F Urban
*Assistant Examiner* — Rui M Hu
(74) *Attorney, Agent, or Firm* — Squire Patton Boggs (US) LLP

(57) ABSTRACT

Various circuitry may benefit from appropriate matching. For example, certain low noise broadband amplifiers may benefit from resistive matching.

2 Claims, 3 Drawing Sheets

(56) References Cited

U.S. PATENT DOCUMENTS

| | | | | |
|---|---|---|---|---|
| 7,619,472 B1* | 11/2009 | Tekin | ................. | H03F 3/45475 330/252 |
| 8,115,549 B2* | 2/2012 | Ogasawara | ............... | H03F 3/19 327/552 |
| 8,260,246 B1* | 9/2012 | Li | ....................... | H03H 7/0153 455/226.1 |
| 8,503,967 B2* | 8/2013 | Liao | ......................... | H03F 1/56 330/124 R |
| 8,705,752 B2* | 4/2014 | Jiang | ........................ | H04R 3/04 330/149 |
| 8,750,818 B2* | 6/2014 | Chung | .................... | H03F 1/26 455/296 |
| 9,000,839 B2* | 4/2015 | Yendluri | ................ | H03F 3/211 327/552 |
| 9,025,709 B2* | 5/2015 | Liao | ......................... | H04B 1/10 375/261 |
| 9,219,507 B2* | 12/2015 | Rofougaran | ......... | H04B 1/1036 |
| 9,595,985 B1* | 3/2017 | Murphy | .................. | H04B 1/10 |
| 9,673,782 B1* | 6/2017 | Andrabi | ................ | H04B 1/005 |
| 2002/0049044 A1* | 4/2002 | Indseth | ................. | H03D 3/007 455/118 |
| 2003/0181188 A1* | 9/2003 | Darabi | .................. | H03G 3/3052 455/313 |
| 2004/0142674 A1* | 7/2004 | Kuiri | ....................... | H04B 1/30 455/334 |
| 2004/0239419 A1* | 12/2004 | Gregorius | ............ | H03G 1/0088 330/86 |
| 2005/0110550 A1* | 5/2005 | Shi | ......................... | H03D 3/008 327/307 |
| 2005/0258896 A1* | 11/2005 | Bardsley | ............... | H03F 1/0277 330/51 |
| 2007/0047669 A1* | 3/2007 | Mak | ....................... | H03D 3/007 375/316 |
| 2007/0159247 A1* | 7/2007 | Lee | ......................... | H03F 1/083 330/253 |
| 2008/0069183 A1* | 3/2008 | Terada | ............... | H04B 1/71635 375/137 |
| 2008/0084236 A1* | 4/2008 | Chung | .................... | H04B 1/30 327/307 |
| 2008/0218273 A1* | 9/2008 | Uehara | ................. | H03F 3/45197 330/306 |
| 2008/0224779 A1* | 9/2008 | Lin | ...................... | H03G 1/0088 330/282 |
| 2009/0098840 A1* | 4/2009 | Vaisanen | ................ | G01R 27/28 455/110 |
| 2009/0167439 A1* | 7/2009 | Zhan | ........................ | H03F 1/26 330/302 |
| 2009/0251216 A1* | 10/2009 | Giotta | ................ | H03F 3/45179 330/258 |
| 2010/0141340 A1* | 6/2010 | Huang | ............... | H03F 3/45197 330/253 |
| 2010/0156538 A1* | 6/2010 | Ogasawara | ............... | H03F 3/19 330/277 |
| 2011/0237212 A1* | 9/2011 | Takemura | ............. | H03D 7/165 455/131 |
| 2013/0178183 A1* | 7/2013 | Rafi | ......................... | H03D 7/12 455/326 |
| 2013/0223569 A1* | 8/2013 | Ito | .......................... | H04L 25/06 375/319 |
| 2013/0271213 A1* | 10/2013 | Chung | .................... | H03F 1/26 330/149 |
| 2014/0045443 A1* | 2/2014 | Rofougaran | ............. | H04B 1/10 455/131 |
| 2014/0155014 A1* | 6/2014 | Leung | .................... | H03D 7/165 455/318 |
| 2014/0329484 A1* | 11/2014 | Lau | ......................... | H03F 1/26 455/296 |
| 2014/0347122 A1* | 11/2014 | Hong | ..................... | H03D 3/00 329/315 |
| 2015/0084688 A1* | 3/2015 | Chang | ................ | H03H 11/0466 327/555 |
| 2015/0194979 A1* | 7/2015 | Jiang | .................... | H04B 1/0003 455/550.1 |
| 2015/0214925 A1* | 7/2015 | Ogasawara | ............ | H03H 11/04 375/350 |
| 2015/0357979 A1* | 12/2015 | Ouchi | ................. | H03F 3/45192 330/9 |
| 2016/0079943 A1* | 3/2016 | Mallinson | ................ | H03F 1/34 330/260 |
| 2016/0233908 A1* | 8/2016 | Mak | ..................... | H03H 19/004 |
| 2016/0336930 A1* | 11/2016 | Matsuno | ................. | H03K 5/02 |
| 2017/0093449 A1* | 3/2017 | Zhu | ........................ | H04B 1/1638 |
| 2018/0026584 A1* | 1/2018 | Park | ......................... | H03F 1/26 330/260 |
| 2018/0034418 A1* | 2/2018 | Blednov | ............... | H03F 1/0288 |
| 2018/0048339 A1* | 2/2018 | Wu | ........................ | H04B 1/109 |

OTHER PUBLICATIONS

Wu, Hao, et al. "A Blocker-Tolerant Inductor-Less Wideband Receiver With Phase and Thermal Noise Cancellation," *IEEE Journal of Solid-State Circuits,* vol. 50, No. 12, Dec. 2015, pp. 2948-2964.

* cited by examiner

LOW NOISE BROADBAND AMPLIFIER WITH RESISTIVE MATCHING

BACKGROUND

Field

Various circuitry may benefit from appropriate matching. For example, certain low noise broadband amplifiers may benefit from resistive matching.

Description of the Related Art

A traditional radio frequency (RF) receiver signal chain uses an RF amplifier first. This amplifier is typically a low noise amplifier (LNA). The input impedance is matched to the antenna using inductors.

BRIEF DESCRIPTION OF THE DRAWINGS

For proper understanding of the invention, reference should be made to the accompanying drawings, wherein.

DETAILED DESCRIPTION

Certain embodiments of the present invention provide a passive mixer and noise cancelling baseband amplifier. The amplifier arrangement of certain embodiments may provide a reduced area and higher linearity compared with previous approaches.

Certain embodiments of an amplifier may be used in a variety of applications. For example, the amplifier according to certain embodiments may be used in RF receiver signal chains, but also may be used in other implementations, such as in sensor amplifiers, such as microphones, accelerometers, and the like.

Figure 1:
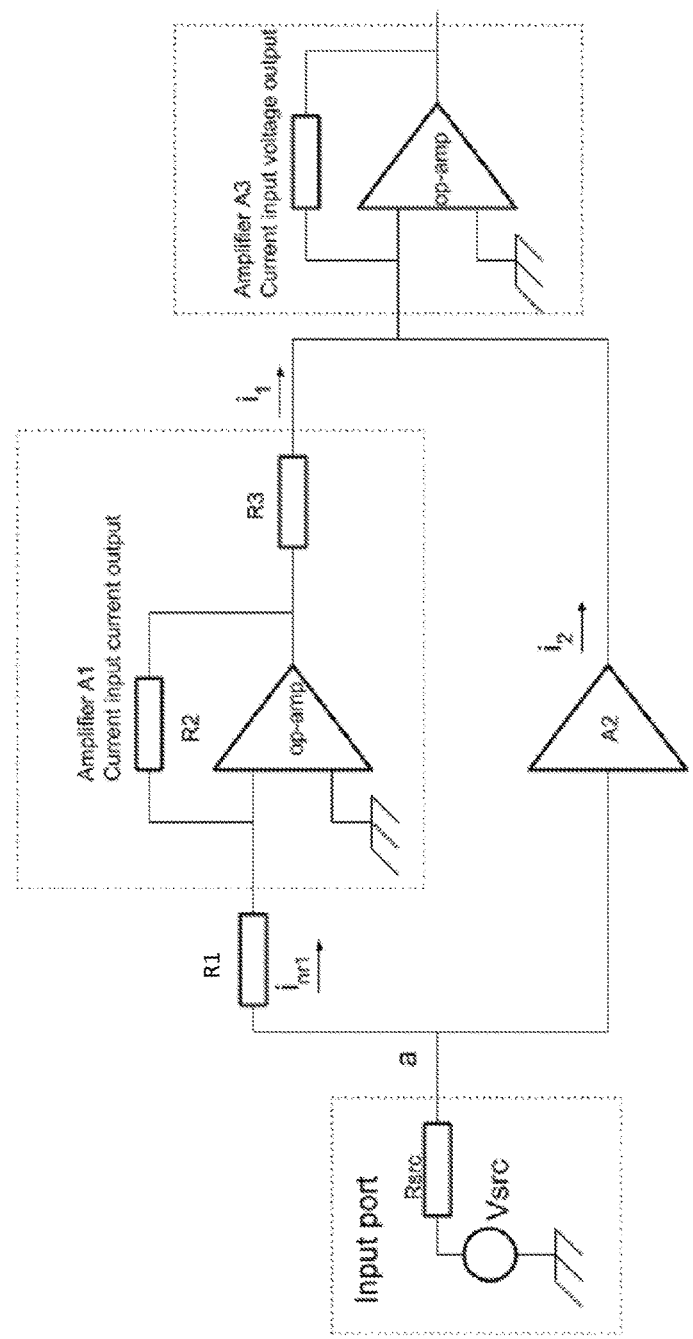
FIG. 1 illustrates a circuit diagram of a circuit according to certain embodiments.

FIG. 1 illustrates a circuit diagram of a circuit according to certain embodiments. The diagram of FIG. 1 provides an example of one implementation of certain embodiments, but as will be discussed below, other implementations are also possible.

As can be seen in FIG. 1, a resistor R1 can be provided between the circuit input, labelled as node a, and a baseband amplifier A1. The baseband amplifier A1 can be configured to receive current input and provide current output. This amplifier can have a low impedance input. The gain of this amplifier can be defined by the ratio of the resistors R2 and R3, such that Gain=−R2/R3.

In parallel with the series connection of resistor R1 and baseband amplifier A1, the circuit can also include a voltage to current amplifier A2 with high input impedance. The gain of this amplifier may be −G2.

The circuit can also include a summing transimpedance amplifier A3. This amplifier can sum currents $i_1$, which is the current from amplifier A1, and $i_2$, which is the current from amplifier A2. The input port can be modelled as a source having a source voltage Vsrc and a source resistance Rsrc, which can provide a voltage $V_a$ at node a.

In operation, this circuit can process input signals from the input port and provide a corresponding amplified signal at the output port. More particularly, a voltage signal on node a can result in current $i_1$ at the output of amplifier A1. The value of this current may be as follows:

$$i_1 = \frac{-R2}{R3} \times \frac{V_a}{R1}$$

The same voltage signal $V_a$ can also result in a current $i_2$ at the output of amplifier 2. The value of this current may be as follows:

$$i_2 = -G2 \times V_a$$

Thus, for voltage signal $V_a$, the sum of the output currents currents $i_1$ and $i_2$ can be as follows:

$$i_1 + i_2 = \left(\frac{-R2}{R3} \times \frac{V_a}{R1}\right) + (-G2 \times V_a)$$

When $$\frac{R2}{R3} = R1 \times G2$$

Then the sum can be simplified as follows:

$$i_1 + i_2 = \left(-R1 \times G2 \times \frac{V_a}{R1}\right) + (-G2 \times V_a)$$

$$i_1 + i_2 = (-G2 \times V_a) + (-G2 \times V_a)$$

$$i_1 + i_2 = -2 \times G2 \times V_a$$

Nevertheless, as noted in FIG. 1, there may be some noise current $i_{nr1}$ from resistor R1. The noise current $i_{nr1}$ from resistor R1 can result in a contribution to output current $i_1$, as follows:

$$i_1 = \frac{-R2}{R3} \times i_{nr1}$$

That same noise current, $i_{nr1}$, can generate a noise voltage Vna on node a, as follows:

$$Vna = R1 \times (-i_{nr1})$$

This noise voltage Vna can result in a contribution to output current $i_2$, as follows:

$$i_2 = -G2 \times R1 \times (-i_{nr1})$$

The sum of these contributions to output currents $i_1$ and $i_2$ is as follows:

$$i_1 + i_2 = \left(\frac{-R2}{R3} \times i_{nr1}\right) + (-G2 \times R1 \times (-i_{nr1}))$$

When $$\frac{R2}{R3} = R1 \times G2$$

Then the sum can be simplified as follows:

$$i_1+i_2=(-R1\times G2\times i_{nr1})+(-G2\times R1\times(-i_{nr1}))$$

$$i_1 i_2 = i_{nr1}(-R1\times G2)+i_{nr1}(G2\times+R1)$$

$$i_1+i_2=-i_{nr1}(G2\times R1)+i_{nr1}(G2\times+R1)$$

$$i_1+i_2=0$$

Thus, in the case where the ratio of resistors R2 and R3 is selected to be equal to the product of R1 and gain G2, then the signal path gain from Va is twice that of G2, while the noise gain from R1 is 0.

The impedance seen looking into node a can be determined by resistor R1. Thus, with appropriate selection of resistor values, the circuit can prevent the noise from this resistor from appearing at the circuit's output.

There can be various modifications to the above embodiments. For example, as shown FIG. 1, there can be a plurality of distinct paths connecting the input port to the output port. The plurality of distinct paths can include a first path and a second path. A first amplifier, namely amplifier A1, can be on the first path and a second amplifier, namely amplifier A2, can be on the second path.

The first path can include a plurality of series connected operational amplifiers. This could be a modification to the circuit shown in FIG. 1. For example, in addition to amplifier A1 there could be additional amplifiers connected in series to A1, optionally between amplifier A1 and the summing amplifier, A3.

The second path can also include a plurality of series connected operational amplifiers. This could be a modification to the circuit shown in FIG. 1. For example, in addition to amplifier A2 there could be additional amplifiers connected in series to A2, optionally between amplifier A2 and the summing amplifier, A3.

The second path can also include a plurality of parallel connected operational amplifiers. This could be a modification to the circuit shown in FIG. 1. For example, in addition to amplifier A2 there could be additional amplifiers connected in parallel to A2, between node a and the summing amplifier, A3.

The above modifications can be applied in combination with one another. For example, the first path can include multiple series-connected operational amplifiers and the second path can include multiple series-connected operational amplifiers and multiple parallel-connected operational amplifiers.

Figure 2:
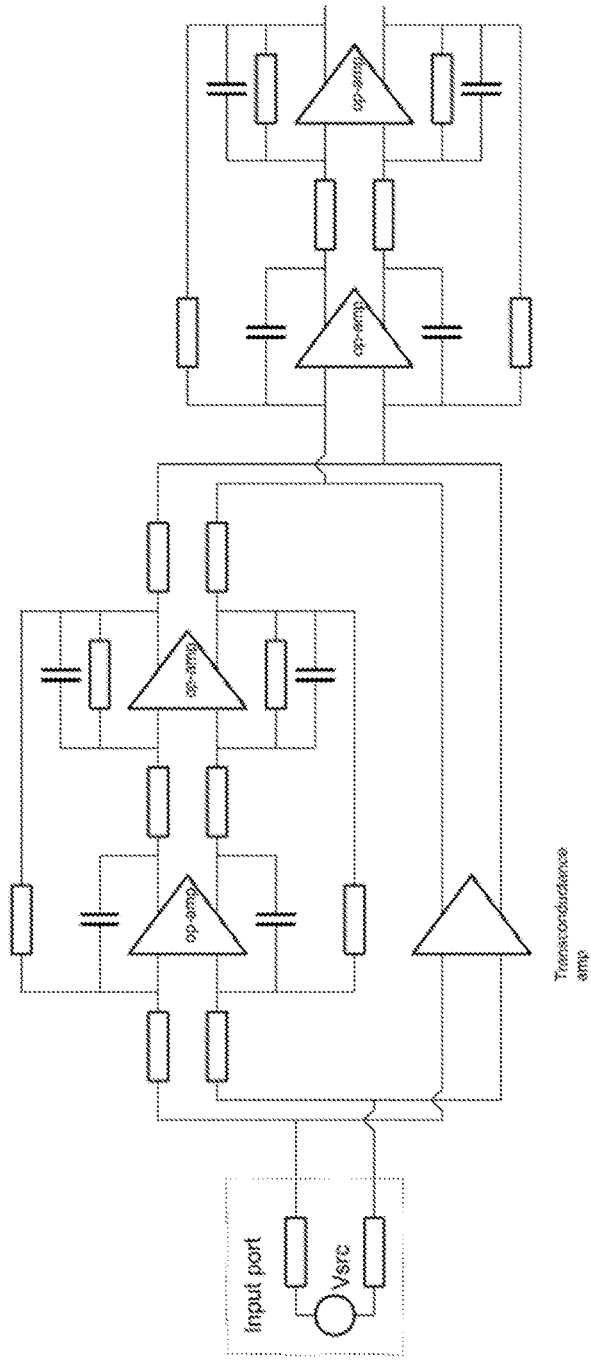
FIG. 2 illustrates an example of a differential implementation, according to certain embodiments.

Both single-ended and differential implementations are possible. FIG. 1 illustrates an example of a single-ended implementation. FIG. 2 illustrates an example of a differential implementation, according to certain embodiments. FIG. 2 shows how an input port can include a differential line instead of a single-ended approach with a ground.

Figure 3:
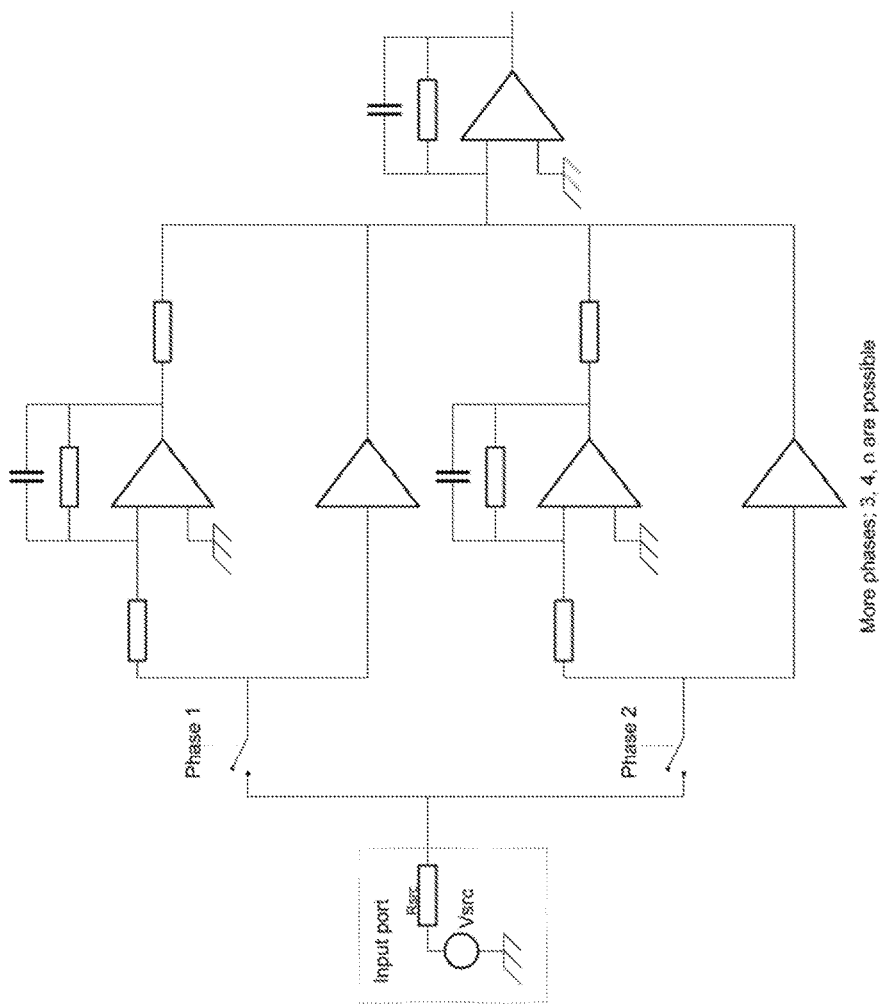
FIG. 3 illustrates an example of a multiple phase implementation, according to certain embodiments.

Both single-phase and multiple phase implementations are possible. FIG. 1 illustrates an example of a single-phase implementation. FIG. 3 illustrates an example of a multiple phase implementation, according to certain embodiments. As shown in FIG. 3, the circuit can included multiple phases. FIG. 3 illustrates two phases, but other numbers of phases are also possible. FIG. 3 illustrates that each of the phases can be selectively switched out. Alternatively, each phase could be provided with a single-phase implementation.

In certain embodiments, capacitors can be used to create frequency dependent transfer functions.

FIG. 1 shows a summing circuit that it is a summing amplifier. There are other possible summing circuits, such as an input stage of an analog to digital converter (ADC) circuit. Likewise, while FIG. 1 illustrates amplifiers A1 and A2 as operational amplifiers (op-amps), other kinds of amplifiers are also permitted.

Certain embodiments can be used for an RF receiver, where a passive mixer is placed in front of the amplifier. The baseband amplifier's input impedance is used for RF impedance matching on the RF side of the passive mixer.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

I claim:

1. A circuit, comprising:
an input port configured to receive a baseband signal;
an output port configured to provide an amplified version of the baseband signal;
a plurality of parallel amplifiers connected to the input port;
a circuit input node, disposed between the input port and the plurality of parallel amplifiers;
a plurality of distinct paths comprising at least a first path and a second path, wherein the first path comprises a first resistor configured to provide an input impedance at the input port, a first amplifier disposed after the first resistor, wherein the first amplifier is one of the plurality of parallel amplifiers, wherein the first path is in-phase to a noise generated by the first resistor and in-phase to the circuit input node, wherein the second path comprises a second amplifier of the plurality of parallel amplifiers, and wherein the second path is anti-phase to the noise generated by the first resistor and in-phase to the circuit input node;
a summing circuit configured to sum outputs of the plurality of parallel amplifiers and provide the amplified version of the baseband signal to the output port,
a second resistor, wherein the second resistor comprises a second resistance and is connected in parallel to the first amplifier;
a third resistor, wherein the third resistor comprises a third resistance and is connected after the first amplifier; and
wherein a product of a first resistance of the first resistor and a gain of the second amplifier is equal to a ratio of the second resistance to the third resistance.

2. The circuit according to claim 1, wherein the circuit is configured to down convert RF to baseband and the circuit further comprises:
a passive mixer comprising an RF side, wherein the plurality of parallel amplifiers connected in a single-phase circuit to the input port, wherein the passive mixer is connected in front of the first amplifier, and the input impedance is configured to match an impedance of the RF side of the passive mixer.

* * * * *